(12) United States Patent
Gonzales et al.

(10) Patent No.: US 10,664,632 B2
(45) Date of Patent: May 26, 2020

(54) WELLBORE THERMAL FLOW, STRESS AND WELL LOADING ANALYSIS WITH JET PUMP

(71) Applicant: LANDMARK GRAPHICS CORPORATION, Houston, TX (US)

(72) Inventors: Adolfo C. Gonzales, Houston, TX (US); Robello Samuel, Cypress, TX (US); Yongfeng Kang, Katy, TX (US); Zhengchun Liu, Sugar Land, TX (US)

(73) Assignee: Landmark Graphics Corporation, Houston, TX (US)

( * ) Notice: Subject to any disclaimer, the term of this patent is extended or adjusted under 35 U.S.C. 154(b) by 338 days.

(21) Appl. No.: 15/035,480

(22) PCT Filed: Nov. 27, 2013

(86) PCT No.: PCT/US2013/072355
§ 371 (c)(1),
(2) Date: May 9, 2016

(87) PCT Pub. No.: WO2015/080741
PCT Pub. Date: Jun. 4, 2015

(65) Prior Publication Data
US 2016/0314225 A1    Oct. 27, 2016

(51) Int. Cl.
*G06F 17/50*   (2006.01)
*E21B 43/12*   (2006.01)
(Continued)

(52) U.S. Cl.
CPC .......... *G06F 30/20* (2020.01); *E21B 41/0092* (2013.01); *E21B 43/124* (2013.01)

(58) Field of Classification Search
CPC ...... G06F 17/5009; G06F 30/20; G06F 30/25; G06F 30/27; G06F 30/28; G06F 2111/00;
(Continued)

(56) References Cited

U.S. PATENT DOCUMENTS

| 4,744,730 A | * | 5/1988 | Roeder | E21B 43/124 417/172 |
| 4,988,389 A | * | 1/1991 | Adamache | E21B 36/04 166/105 |

(Continued)

FOREIGN PATENT DOCUMENTS

CA    2825430    8/2012

OTHER PUBLICATIONS

Rosland et al. (Collaborative Well Planning and Optimization of Well Placement: A Case Study From Mangala Field Development, Rajasthan India, SPE, 2010, pp. 1-20) (Year: 2010).*

(Continued)

*Primary Examiner* — Iftekhar A Khan
(74) *Attorney, Agent, or Firm* — Locke Lord

(57) ABSTRACT

A method for simulating a well system can include providing a well system model, providing a jet pump model, providing at least one calculation engine, inputting an input parameter, defining a mechanical configuration of the well system, integrating a jet pump model into a well system model, computing a solution to a model, and determining at least one production condition of a well system. A computer readable medium can have instructions stored thereon that, when executed by a processor, can cause the processor to perform a method including accessing a well system model, accessing a jet pump model, integrating the jet pump model and the well system model, computing a solution to a combined model, and determining a production condition of a well system.

17 Claims, 6 Drawing Sheets

(51) Int. Cl.
*E21B 41/00* (2006.01)
*G06F 30/20* (2020.01)

(58) Field of Classification Search
CPC . G06F 2119/22; E21B 41/0092; E21B 43/124
USPC .......................................................... 703/10
See application file for complete search history.

(56) References Cited

U.S. PATENT DOCUMENTS

| | | | |
|---|---|---|---|
| 6,263,984 B1* | 7/2001 | Buckman, Sr. | E21B 7/061 175/424 |
| 6,305,216 B1 | 10/2001 | Samaroo | |
| 6,354,371 B1* | 3/2002 | O'Blanc | E21B 43/124 166/154 |
| 6,668,948 B2* | 12/2003 | Buckman, Sr. | B05B 1/3447 175/393 |
| 7,686,101 B2* | 3/2010 | Belew | E21B 7/046 175/62 |
| 7,699,107 B2* | 4/2010 | Butler | E21B 7/061 166/308.1 |
| 7,963,327 B1* | 6/2011 | Saleri | E21B 43/00 166/252.1 |
| 8,196,680 B2* | 6/2012 | Buckman, Sr. | E21B 29/06 175/62 |
| 8,352,227 B2 | 1/2013 | Klumpen | |
| 8,991,522 B2* | 3/2015 | Randall | E21B 7/061 175/67 |
| 9,816,533 B2* | 11/2017 | Falk | F04F 5/48 |
| 9,845,652 B2* | 12/2017 | Wolfe | E21B 33/063 |
| 9,976,351 B2* | 5/2018 | Randall | E21B 43/26 |
| 2002/0177955 A1 | 11/2002 | Jalali et al. | |
| 2005/0121191 A1* | 6/2005 | Lambert | E21B 37/00 166/265 |
| 2005/0173114 A1* | 8/2005 | Cudmore | E21B 43/121 166/250.15 |
| 2010/0042458 A1* | 2/2010 | Rashid | E21B 43/122 703/10 |
| 2010/0191516 A1* | 7/2010 | Benish | E21B 43/00 703/10 |
| 2010/0243266 A1* | 9/2010 | Soby | E21B 7/18 166/373 |
| 2011/0022368 A1* | 1/2011 | Huang | E21B 43/00 703/10 |
| 2012/0059640 A1* | 3/2012 | Roy | G06F 30/20 703/10 |
| 2012/0211228 A1 | 8/2012 | Troshko et al. | |
| 2013/0035919 A1* | 2/2013 | Al-Shammari | G06F 30/20 703/10 |
| 2013/0035920 A1* | 2/2013 | Al-Shammari | E21B 43/12 703/10 |
| 2013/0211811 A1* | 8/2013 | Zhu | G06F 30/20 703/22 |
| 2013/0304444 A1* | 11/2013 | Strobel | G06F 30/20 703/10 |
| 2014/0034390 A1* | 2/2014 | Mitchell | G06G 7/56 175/57 |
| 2014/0039836 A1* | 2/2014 | Moricca | F04D 15/00 702/184 |
| 2015/0308434 A1* | 10/2015 | Crane | F04D 13/12 417/54 |

OTHER PUBLICATIONS

D. T. Hatzlavramldls ("Modeling and Design of Jet Pumps", SPE, 1991, pp. 413-419) (Year: 1991).*
Rosland et al. ("Collaborative Well Planning and Optimization of Well Placement: A Case Study From Mangala Field Development, Rajasthan India", SP 2010, pp. 1-20) (Year: 2010).*
Samad et al. ("Flow Analyses Inside Jet Pumps Used for Oil Wells", International Journal of Fluid Machinery and Systems, 2013, pp. 1-10) (Year: 2013).*
Copenheaver, PCT Search Report for PCT Application No. PCT/US2013/072355 dated Apr. 28, 2014.
Copenheaver, PCT Written Opinion for PCT Application No. PCT/US2013/072355 dated Apr. 28, 2014.
CFD Tool for pump Design products page downloaded at www.simerics.com/products, pp. 1-2.
PTC freeware well performance simulator for jet pump downloaded at https://apps.ptc.as, pp. 1.
Jet-Pump Lifting Systems, brochure, pp. 1-8, 2015.
A.W. Grupping, J.L.R. Coppes, J.G. Groot: Fundamentals of Oilwell Jet Pumping, SPE 15670-PA, SPE Production Engineering, vol. 3, No. 1, pp. 9-14, Feb. 1988.
Canadian Office Action for Canadian Application No. 2925719 dated Mar. 1, 2017.

* cited by examiner

Jet Pump enhanced Production Details

| 3 ½" Production Tubing | Annulus | Options | Ocean Current | Comments |

Pressure: 12000.00 psi — 702
Jet Pump Depth: 17500 ft MD — 704
Inlet Temperature: 40.00 °F — 706
Injection Rate: 200.0 gpm — 708
Jet Pump Nozzle Diameter: 0.0095 in² — 710
Nozzle-to-Throat-Area ratio: 0.302 — 712
Duration: 1.00 days — 714

Location: Wellhead — 716

OK    Cancel    Apply    Help

WELLBORE THERMAL FLOW, STRESS AND WELL LOADING ANALYSIS WITH JET PUMP

FIELD OF INVENTION

The inventions disclosed and taught herein relate generally to methods and systems for wellbore analysis; and more specifically relate to systems and methods for analyzing and simulating well systems comprising jet pumps.

BACKGROUND OF INVENTION

Computer implemented methods for drilling and completions are important in the oil and gas industry for casing and tubing design. Proper casing and tubing design are important for successful drilling and completion of oil, gas and other wells, particularly in high pressure, high temperature (HP/HT) environments, such as deep water and heavy oil. Computer modeling of the complex temperature and pressure characteristics in a wellbore can be an important tool to design the most appropriate casing and tubular design and avoid undesirable effects due to, for example, trap annular pressure or unstable load stresses in salt zones. Computer modeling and analysis can require the performance of a number of tasks, such as simulating fluid flow and heat transfer during drilling operations, analyzing single casing loads and buckling behavior under complex mechanical, fluid pressure, and thermal-loading conditions, simulating fluid flow and heat transfer during completion, production, stimulation, testing, and well-servicing operations, analyzing tubing loads and movements, buckling behavior, and design integrity under complex mechanical, fluid-pressure, and thermal-loading conditions, and predicting pressure and volume changes due to annular pressure buildup (APB) when the well system heats up as a result of production operations or the injection of hot fluids into the well. In well systems employing artificial lift, it can be important that petroleum engineers and well designers be able to predict the performance of hydrocarbon production wells. Some well systems having artificial lift can include a jet pump for generating jet pump lift. Therefore, there is a need in the art for improved systems and methods for predicting, modeling and analyzing the performance of wells, such as hydrocarbon-producing wells, utilizing jet pump lift.

BRIEF DESCRIPTION OF DRAWINGS

FIG. 7 illustrates another of many embodiments of a user interface according to the disclosure.

DETAILED DESCRIPTION OF DISCLOSED EMBODIMENTS

Figure 1:
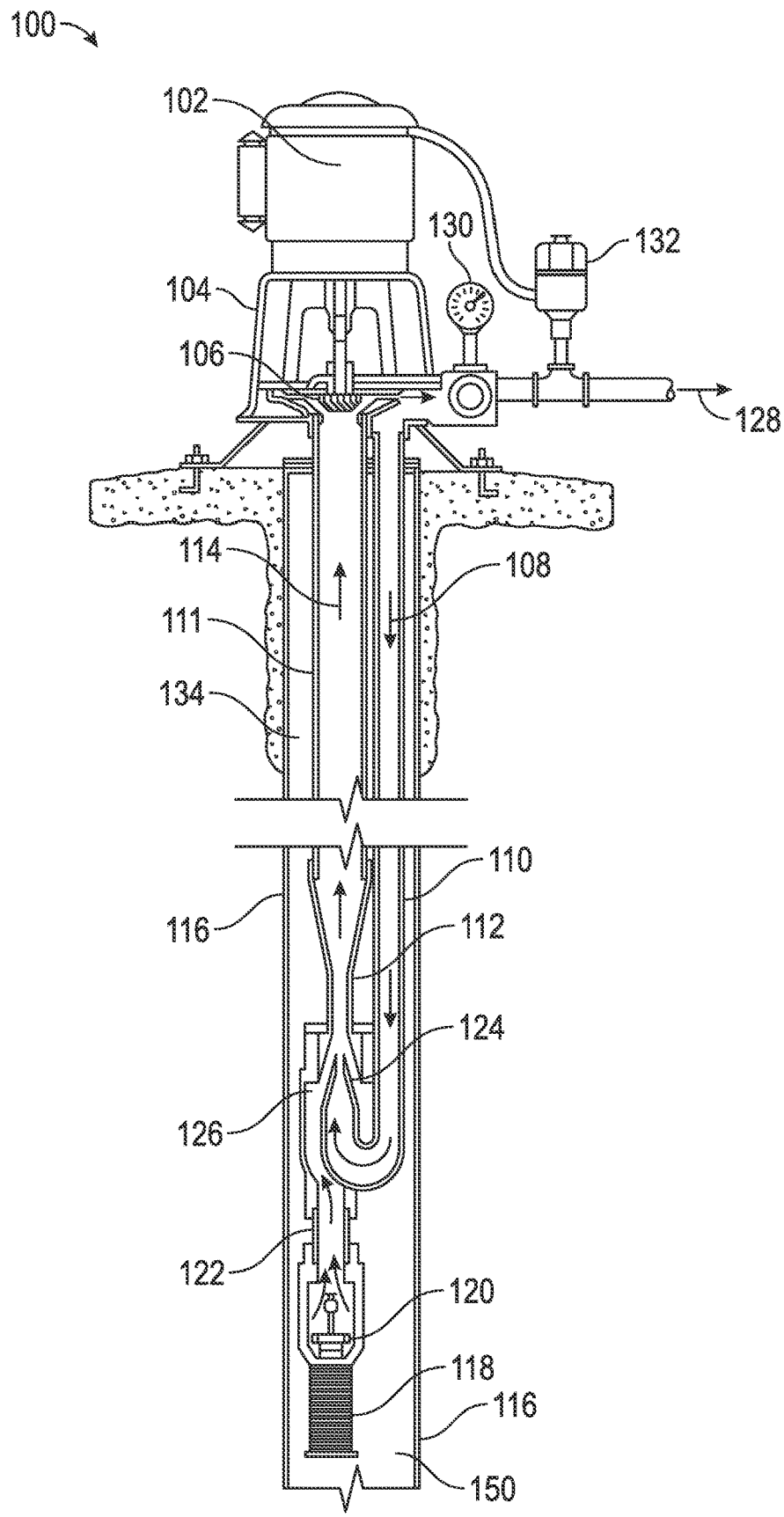
FIG. 1 is a schematic diagram of one of many embodiments of a well system having a jet pump according to the disclosure.

The Figures described above and the written description of specific structures and functions below are not presented to limit the scope of what Applicants have invented or the scope of the appended claims. Rather, the Figures and written description are provided to teach any person ordinarily skilled in the art to make and use the invention for which patent protection is sought. Those skilled in the art will appreciate that not all features of a commercial embodiment of the invention are described or shown for the sake of clarity and understanding. Persons of skill in this art will also appreciate that the development of an actual commercial embodiment incorporating aspects of the present invention will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location, and from time to time. While a developer's efforts might be complex and time-consuming in an absolute sense, such efforts would be, nevertheless, a routine undertaking for those of ordinary skill in this art having benefit of this disclosure. It must be understood that the invention disclosed and taught herein is susceptible to numerous and various modifications and alternative forms. Lastly, the use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the invention or the appended claims. When referring generally to such elements, the number without the letter is used. Further, such designations do not limit the number of elements that can be used for that function. The terms "couple," "coupled," "coupling," "coupler," and like terms are used broadly herein and can include any method or device for securing, binding, bonding, fastening, attaching, joining, inserting therein, forming thereon or therein, communicating, or otherwise associating, for example, mechanically, magnetically, electrically, chemically, operably, directly or indirectly with intermediate elements, one or more pieces of members together and can further include without limitation integrally forming one functional member with another in a unity fashion. The coupling can occur in any direction, including rotationally. The terms "including" and "such as" are illustrative and not limitative. The term "can" as used herein means "can, but need not" unless otherwise indicated. Each structure, component and other item included herein will have certain inherent physical or other characteristics when and if present in one or more embodiments of the present inventions, such as dimension(s) (e.g., height, width, length, diameter), mass, weight, imaginary axes, cross-sections and the like. It will be understood by a person of ordinary skill in the art that such characteristics are present, and that such items exist in one or more environments, regardless of whether expressly described or mentioned herein. The terms "fluid" and "fluids" as used herein (e.g., formation fluids, reservoir fluids, power fluids, treatment fluids, production fluids, other fluids, mixtures thereof, etc.) include any non-fluid materials contained, mixed and/or carried in the fluid material(s), unless otherwise indicated.

This disclosure provides systems and methods for predicting, simulating, modeling or otherwise analyzing well systems comprising jet pumps. A jet pump is an apparatus or system for providing artificial lift in oil, gas or other wells, for example, by adding energy to the fluid column for improving production from the well. A method for analyzing a well system can include providing a well system model, providing a jet pump model, providing at least one calculation engine, inputting an input parameter, defining a mechanical configuration of the well system, integrating a jet pump model into a well system model, computing a solution to a model, and determining at least one production condition of a well system. A system for analyzing a well system can include a computer readable medium with instructions stored thereon that, when executed by a processor, can cause the processor to perform a method including accessing a well system model, accessing a jet pump model, integrating the jet pump model and the well system model, computing a solution to a combined model, and determining a production condition of a well system.

Figure 2:
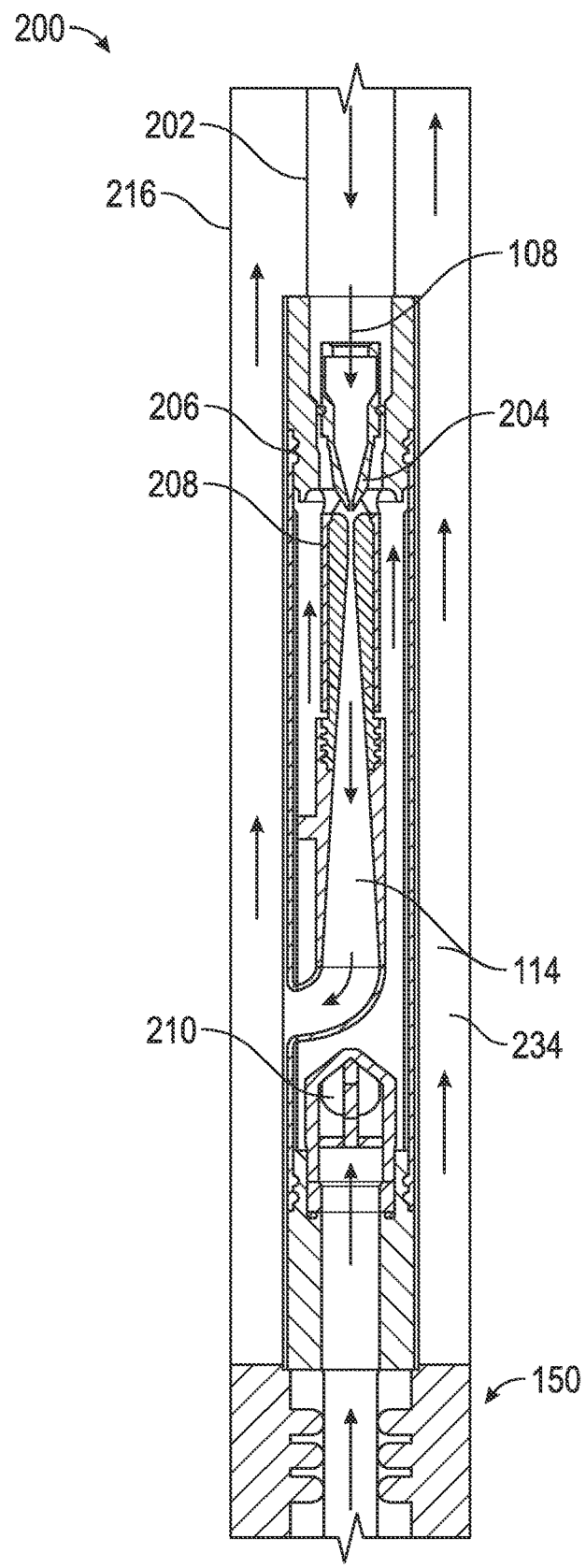
FIG. 2 is a schematic diagram of another of many embodiments of a well system having a jet pump according to the disclosure.
Figure 3:
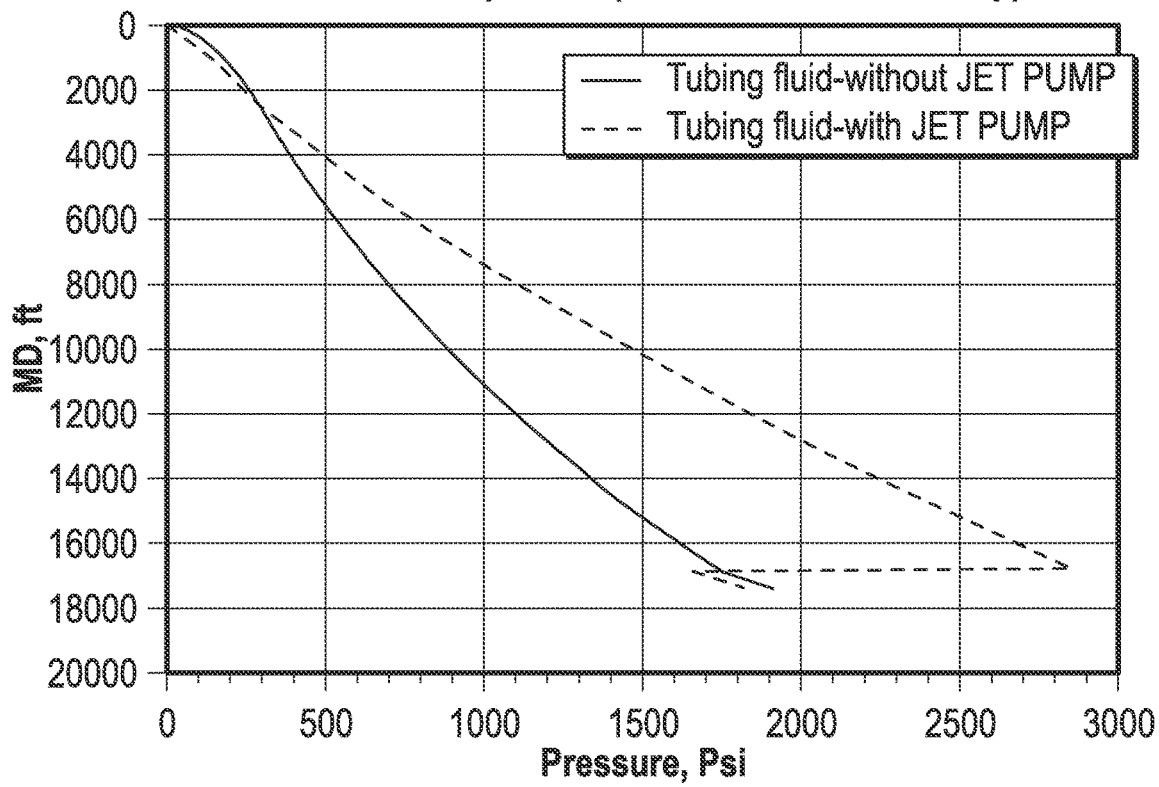
FIG. 3 is a chart illustrating pressure changes in one of many embodiments of a well system with and without a jet pump according to the disclosure.
Figure 4:
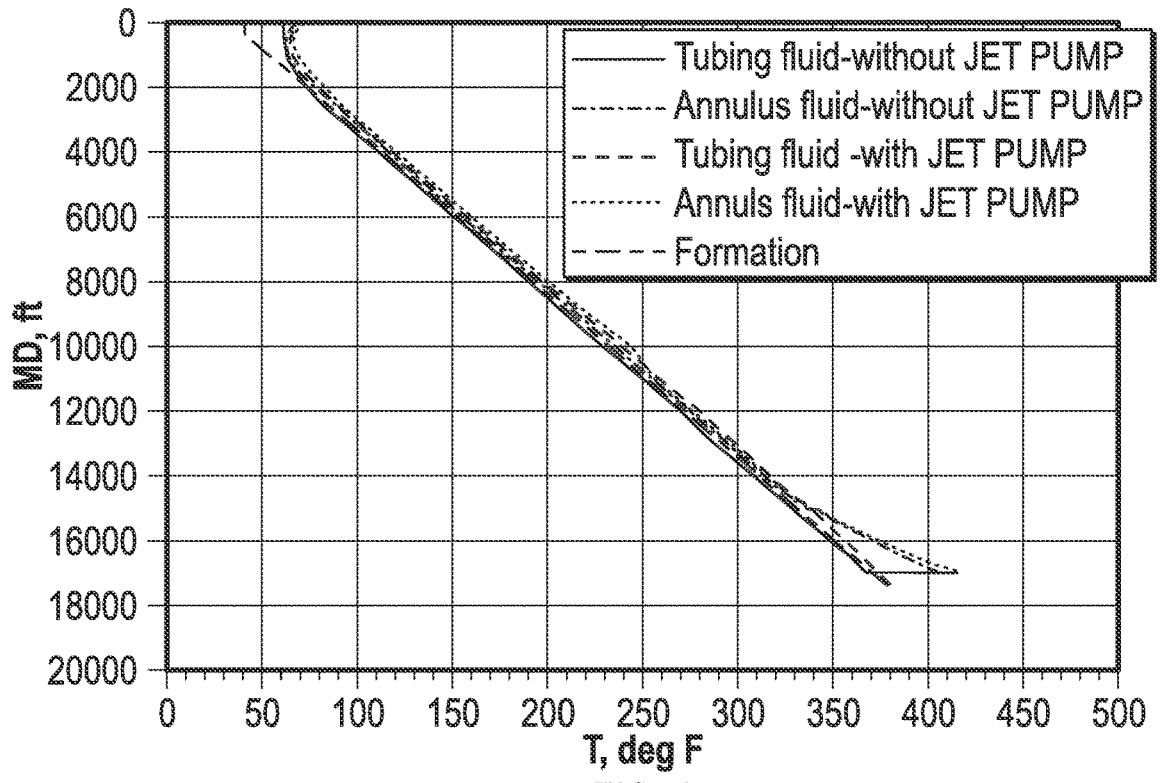
FIG. 4 is a chart illustrating temperature changes in one of many embodiments of a well system with and without a jet pump according to the disclosure.

FIG. 1 is a schematic diagram of one of many embodiments of a well system having a jet pump according to the disclosure. FIG. 2 is a schematic diagram of another of many embodiments of a well system having a jet pump according to the disclosure. FIG. 3 is a chart illustrating pressure changes in one of many embodiments of a well system with and without a jet pump according to the disclosure. FIG. 4 is a chart illustrating temperature changes in one of many embodiments of a well system with and without a jet pump according to the disclosure. FIGS. 1-4 will be described in conjunction with one another. Jet pump systems (or simply "jet pumps" for convenience), such as exemplary jet pumps 100, 200, can include numerous components (including both surface and subsurface components) for providing artificial lift in well systems, such as hydrocarbon (e.g., oil, gas) well systems. For example, jet pump 100 can include a motor 102 which can drive a centrifugal pump 104. Centrifugal pump 104 can include an impeller 106 for moving fluid, such as through one or more conduits, whether directly or indirectly. For example, pump 104 can move power fluid 108 down hole, up hole, or both, such as through one or more conduits 110, which can include pipe, tubing, or other structure defining a flow path, such as a return pipe. Power fluid 108 can include, for example, water injected down a wellbore 150 through a flow stream and which is mixed with hydrocarbon production and then pumped or otherwise moved to the surface through another flow stream. Power fluid 108 can circulate back to pump 104 through one or more other conduits, such as conduit 111. Between the times that power fluid 108 leaves and returns to the surface, it can pass through one or more other components of jet pump 100, such as a venturi 112. Venturi 112 can create a low pressure area which can cause production fluid 114 (which can, but need not, include treatment fluid, as the case may be) to flow from a formation and upward through wellbore 150, such as within casing 116 or a conduit housed within casing 116. In at least one embodiment of jet pump 100, production fluid 114 can pass through one or more filtration systems 118, such as a screen, filter or other filtering assembly or device. Production fluid 114 can also (or alternatively) pass through one or more valves 120, such as a foot valve, standing valve, check valve or other valve, and into one or more conduits 122, such as tubing or pipe. The low pressure created by venturi 112 can draw or otherwise bias the production fluid 114 upwardly past or near a nozzle 124, such as through a fluid passage 126, where it can commingle with the power fluid 108 and continue toward the surface or wellhead. Production fluid 114 elevated to the surface in this manner can be directed through a discharge 128, such as a discharge pipe, from which it can be collected, stored, or otherwise directed by a well operator. Jet pump 100 can include components for monitoring and/or controlling one or more aspects of the system. For example, fluid pressure in jet pump 100 and discharge 128 can be monitored and/or controlled, for example, by one or more gauges 130 or switches 132, such as regulating pressure gauges and pressure switches, separately or in combination with one or more other components for monitoring and/or controlling fluid flow, such as valves, conduits, fluid fittings and the like.

As shown in FIG. 1 for illustrative purposes, in some jet pump systems, such as jet pump 100, power fluid 108 can be injected into a flow stream through an annulus 134 of the casing 116 and can be produced, separately or in combination with production fluid 114, through production conduit 111, which can be disposed centrally or otherwise within or relative to casing 116. However, this need not be the case and, alternatively, power fluid 108 can enter and exit a wellbore in other manners. For example, as shown in FIG. 2 for illustrative purposes, in some jet pump systems, such as jet pump 200, power fluid 108 can be injected into a flow stream through one or more conduits 202, such as a centrally (or otherwise) disposed tubing, pipe or other conduit, and can be produced, separately or in combination with production fluid 114, through the annulus 234 of casing 216. With continuing reference to FIG. 2, the power fluid 108 can pass through a jet valve nozzle 204, which can be coupled to or otherwise supported by (including being formed integrally with, in whole or in part) a support 206, such as a jet pump housing or other structure. Power fluid 108 can pass from nozzle 204 into a jet pump carrier 208, which can create a low-pressure area for drawing production fluid 114 through a valve 210 or otherwise into a portion of the system where the formation fluid can commingle with the power fluid. Such a mixture, if and when present, can be released or otherwise directed into the annulus 234, i.e., the area between conduit 202 and casing 216. The formation fluid, power fluid or mixture thereof can be moved upstream or produced through the annulus 234 at the surface. It will be understood that fluid injected, produced or which otherwise passes through an annulus of a wellbore can move in the space between the tubing and the casing (e.g., FIG. 2) or can alternatively move through one or more conduits or other flow paths disposed in such space (e.g., FIG. 1).

Introduction of one or more jet pumps into a well system can impact the design and operation of a well. For example, during the pumping process, heat can be generated by one or more components of the jet pump, which can raise the temperature of operation fluids passing through or near such components. Further, jet pumps can result in pressure changes in the well. In at least some well systems, the shifts in temperature and/or pressure that can occur upon introduction of a jet pump can be significant, such as by having magnitudes that can be worthy of consideration in the design, analysis or implementation of a particular application. For purposes of explanation only, and not by way of limitation, FIGS. 3 and 4 presented herein illustrate changes based on the presence of a jet pump in one embodiment of a well system according to the disclosure, which embodiment is but one of many. For example, FIG. 4 shows exemplary temperature changes in the annulus and tubing of one of many well systems with and without a jet pump present. As seen in the Figure, the temperature in both the tubing and the annulus can be increased by a jet pump disposed along the measured depth of the wellbore. In this particular example, the temperature of the well fluid(s) can increase approximately 40° F. at a depth of 17,000 feet due to the presence of a jet pump. Similarly, FIG. 3 shows that the pressure inside the tubing can increase during operation of a jet pump—in this implementation, increasing by approximately 1100 PSI at a depth of 17,000 feet (versus the same well system absent the jet pump). Of course, these are only examples presented for purposes of clarity and explanation, and it will be understood by one of ordinary skill in the art having the benefits of the present disclosure that the changes in temperature, pressure, or other characteristics of a well system can, and likely will, vary from application to application, and well to well, depending on a host of factors (e.g., formation, well depth, environment, one or more of the other factors discussed elsewhere herein, etc.), separately or in combination with one another or one or more other factors in accordance with a particular application.

Increases in temperature and/or pressure caused by the presence of a jet pump can impact various aspects of a well system, including aspects that underlie the design and/or modeling of a well. For example, jet pumps can impact the structural analyses of one or more wellbore components, such as stress, strain or other analyses of tubing, casing, or other components. As other examples, the effects of a jet pump on a well system can affect the trap annular pressure of the well, wellhead movement, or other characteristics, and related analyses. Pressure and temperature changes that can result from jet pump operations can be based on the specifications of a particular jet pump (which can be any jet pump), and the various parameters and factors defining or otherwise relating to relevant operating conditions can be many. These parameters can include, for example, variables such as pump intake pressure or other pressures, densities, including density differences between power fluids and produced or other fluids, flow areas, cross-sectional areas, FVF, component efficiencies, area ratios, pressure-recovery ratios, flow ratios, including mass flow ratios, water cut, acceleration of gravity, dimensions (e.g., height, width, length, distance, etc.), shapes, loss coefficients (e.g., regarding suction loss or loss from one or more components, such as nozzles, throats, diffusers, etc.), pressure losses or differences, flow rates of one or more fluids, friction forces or coefficients, gas-oil ratios (GOR), velocities, magnitudes, values or other expressions of any of the foregoing, or other factors in accordance with a particular application, in whole or in part, separately or in combination. Of course, this list is not exhaustive, but rather is merely illustrative of the variables and other aspects that can be considered in the design, modeling, estimation or other applicable analysis of a well system (including potential wells) in which one or more jet pumps can or will be utilized. One set of expressions for determining the performance of a jet pump that can be helpful in one or more applications is described in A. W. Grupping, J. L. R. Coppes & J. G. Groot, *Fundamentals of Oilwell Jet Pumping*, SPE Production Engineering, February 1988, at 9-14; see also Clay Griffin, *Discussion of Fundamentals of Oilwell Jet Pumping*, SPE Production Engineering, May 1988, at 280; A. W. Grupping, *Author's Reply to Discussion of Fundamentals of Oilwell Jet Pumping, Id.*

Figure 5:
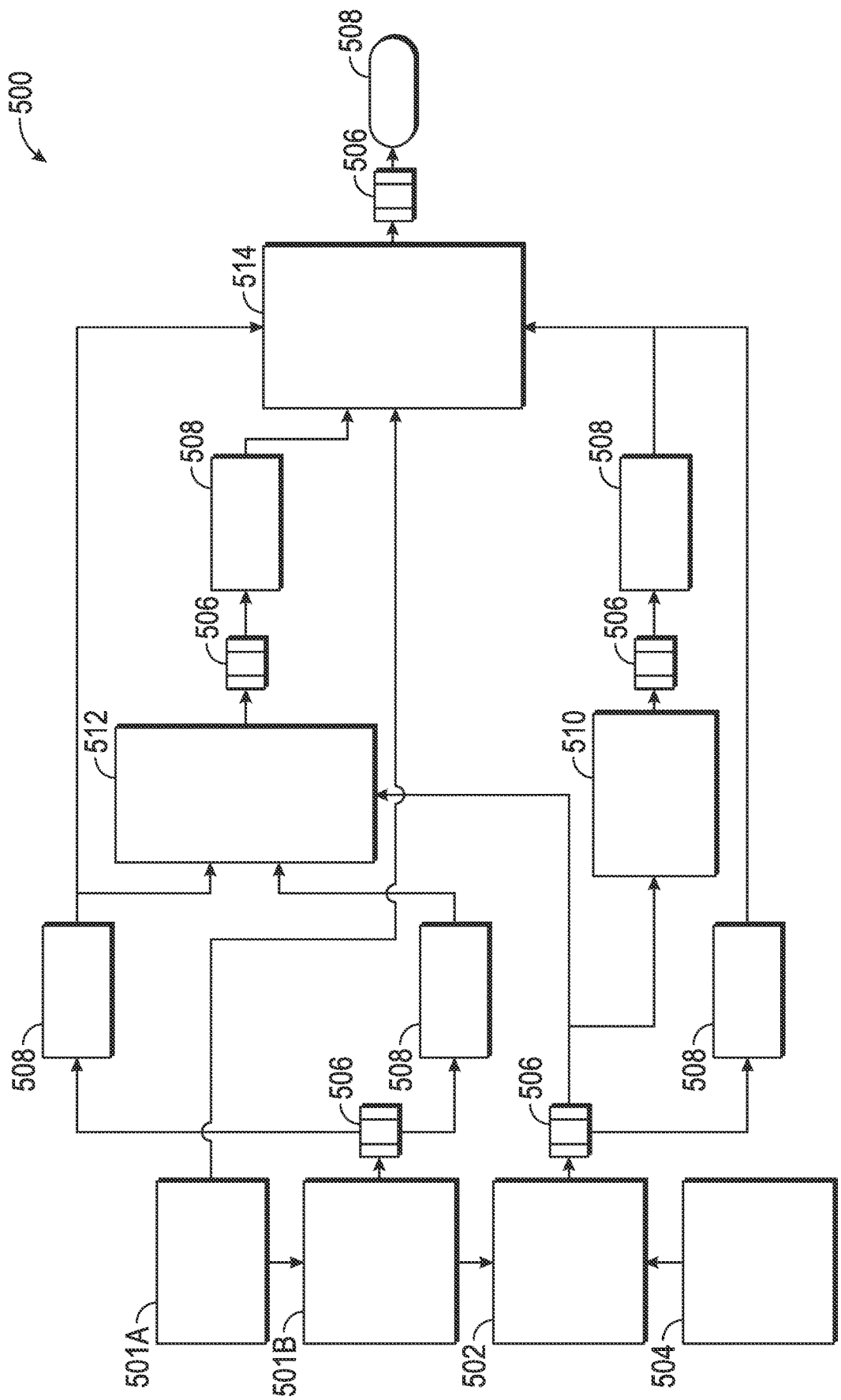
FIG. 5 is a flow diagram illustrating one of many embodiments of an analysis system and method according to the disclosure.
Figure 6:
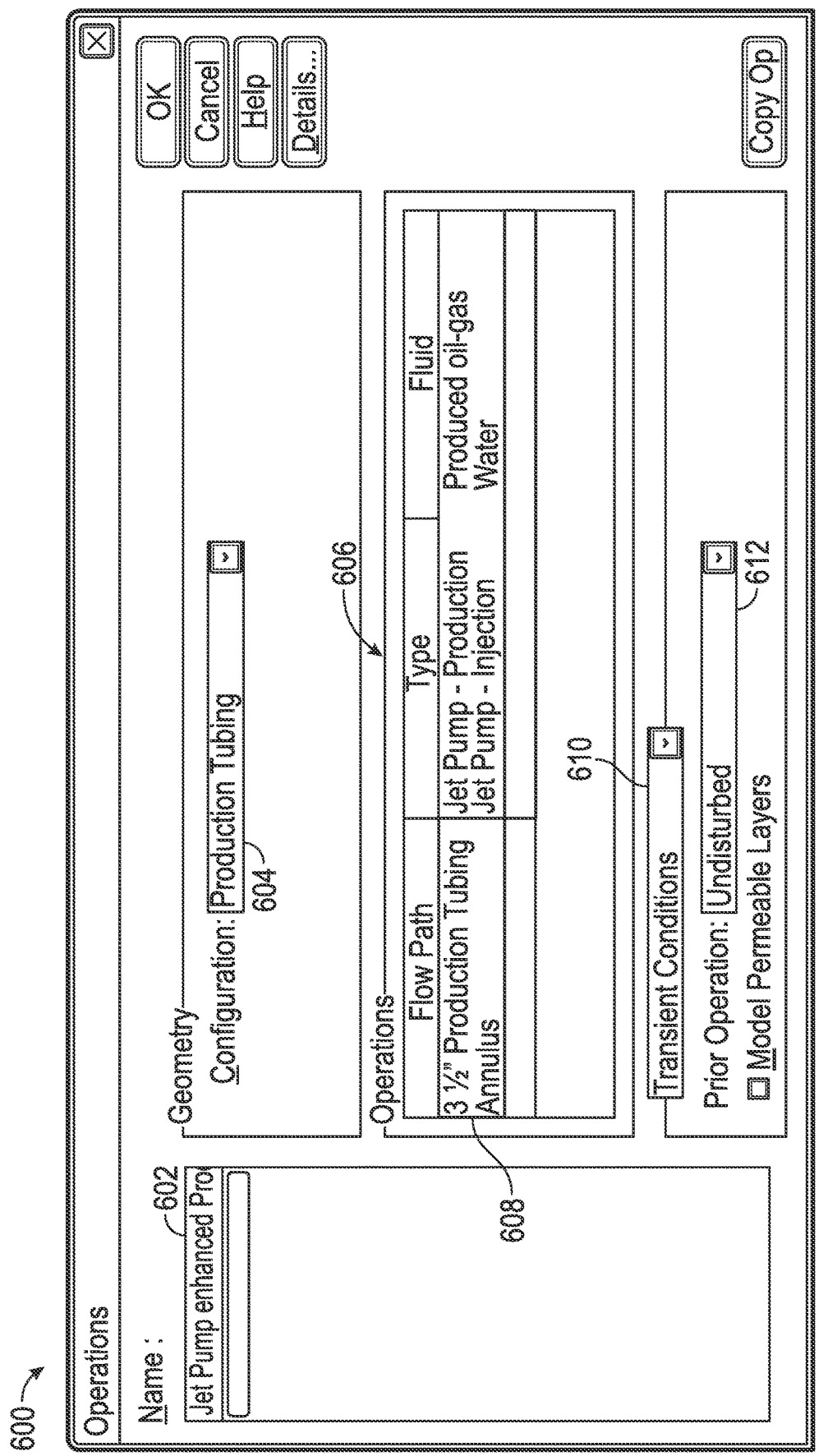
FIG. 6 illustrates one of many embodiments of a user interface according to the disclosure.

FIG. 5 is a flow diagram illustrating one of many embodiments of an analysis system and method according to the disclosure. FIG. 6 illustrates one of many embodiments of a user interface according to the disclosure. FIG. 7 illustrates another of many embodiments of a user interface according to the disclosure. FIGS. 5-7 will be described in conjunction with one another. In at least one embodiment of the present invention, which is but one of many, there can be provided a method for simulating a completion production system for a well including a jet pump. One or more computer models can be provided, at least one of which can take into account one or more effects that a jet pump (which can be any jet pump or combination thereof) can have on the design and/or performance of a well. A computational or computer model generally refers to a mathematical model that can simulate the behavior of a system, such as the thermal, stress and/or loading of a well, and which can allow a user to analyze the behavior of the system. The methods and systems of the present inventions can, but need not, be incorporated into an existing (or future developed) software package for analyzing well systems, such as a program that can enable engineers or other users to model or otherwise analyze one or more aspects of a well system in an effort to obtain one or both of the right well integrity and the best cost configuration for a particular well system, which can be any well system.

Referring now to FIG. 5, a flow chart according to one embodiment is shown. System 500 can generally include one or more modules and one or more calculation engines for modeling one or more aspects of a well system, which can include one or more user interfaces for allowing a user and computer system to interact (as further described below). System 500 can be adapted to analyze or otherwise consider (including allowing or enabling a user to do so) one or more of any number of factors in accordance with a particular well system application, such as, for example, thermal flow, stress analysis and/or well loading (e.g., trap annular pressure and wellhead movement). System 500 can be or include, for example, all or part of an expanded user interface (UI) for calculating factors such as thermal flow, stress and well loading for accurately or otherwise incorporating the effects of incorporating a jet pump as part of a completion production system, which can be any production system. In at least one embodiment of the present invention, which is but one of many, system 500 can include a production module 502 for modeling, predicting or otherwise analyzing one or more characteristics of a well system, such as one or more production characteristics. For example, production module 502 can be adapted to analyze one or more production conditions, such as production temperatures, production pressures, or other production conditions, during one or more phases of production. These phases can include any of a number of events that can take place during production, including, for example, circulation events, production events, injection operations, and other operations. In at least one embodiment, production module 502 can include a definition (which can include a collection or other plurality of definitions) of the mechanical configuration(s) of one or more well systems, such as a definition based on all known (including assumed) characteristics of the well(s). For example, a well system definition can include definitions of casing, holes, fluids, undisturbed or other temperatures, tubing or other conduits, or other definitions, such as definitions of or relating to any one or more of the other factors, parameters or variables described herein. Each well system definition can be based on any number of factors or definitions required by a particular application, separately or in combination, in whole or in part. In at least one or more other embodiments of system 500, production module 502 need not include one or more well system definitions, and alternatively can gather such definition(s) from one or more other modules, such as by accessing or otherwise communicating with one or more other modules. For example, one or more well system definitions can be included in a mechanical configuration module 501A for defining one or more physical aspects of a well system, a drilling module 501B for analyzing one or more aspects of a well system during drilling operations, or other modules according to a particular application or software system with which system 500 can be utilized.

System 500 can include a jet pump module 504 for cooperating with one or more other components of the system to analyze one or more characteristics of a well system having a jet pump. Jet pump module 504 can be incorporated into production module 502, in whole or in part, such as by being a sub-module thereof. But, this need not be the case, and jet pump module 504 can alternatively be wholly or partially separate from module 502 and adapted to be accessed by or otherwise cooperate with module 502 and/or other portions of the system. In at least one embodiment of the present invention, jet pump module 504 can be or include a computer implemented model(s) of one or more jet pumps, or any other set of data or other definitions defining one or more jet pump characteristics. Jet pump module 504 can include the definition for a single jet pump or the definitions of each of a plurality of jet pumps that can or may be used or included in one or more well systems. Alternatively, jet pump module 504 can include portions of one or more jet pump definitions. In these manners, jet pump module 504 can add to a production operation dialog the definition(s) of one or more jet pump operations. Each jet pump definition can include any number of parameters according to a particular application or implementation, such as, for example, jet pump names or other identification (ID), jet pump locations (e.g., depth), power or other fluid flow streams, injection flow streams, discharge flow streams, mixing locations, production flow streams, temperatures (e.g., inlet temps, outlet temps, injection temps, fluid temps, wellbore temps, formation temps, or other temps), flow rates (e.g., power fluid or production fluid flow rates), fluid compositions, component or wellbore characteristics (e.g., dimensions, areas, materials, diameters, ratios thereof), or other factors, such as pressures, times, elapsed times, or any one or more of the other factors, parameters or variables described herein, separately or in combination, in whole or in part.

System 500 can include one or more calculation engines 506 (collectively, "calculation engine 506") for computing one or more selected operations. In at least one embodiment, a calculation engine 506 can be adapted to compute one or more operations in view of any of a set of selectable analysis options, such as transient or steady-state conditions or, as another example, thermal flow simulation options. Calculation engine 506 can perform one or more calculations or other operations in view of the configuration of one or more wellbores or other well systems, which can be included in one or modules of system 500, such as those described above. As with other modules of system 500, a configuration of a well system can, but need not, be defined via one or more user interfaces, which can include GUIs or other interfaces, as further described elsewhere herein. System 500 can be adapted to generate one or more output results, such as, for example, output results including wellbore fluids (e.g., in tubing and/or annulus) and strings (tubing and casing, etc.), temperatures, pressures, fluid flow rates and velocities, densities, plastic viscosities or yield points, or other outputs, such as liquid hold ups or flow regimes, separately or in combination, in whole or in part. Such outputs can be represented at a user interface, such as, for example, by way of single, multiple or other texts, summaries, plots, tables or reports, which can include generation of flat files, xml documents or other files or materials that can be used, understood or perceived by a user. System 500 can include one or more output modules 508 (collectively, "output module 508") for using, displaying or otherwise communicating one or more outputs. Output module 508 can include any type or number of output modules required by a particular application, such as, for example, output modules for final or other production temperatures and/or pressures for a well system including one or more jet pumps. Further, output module 508 can include one or more predetermined analysis modules, such as one or more tubing modules 510 for performing stress or other mechanical analyses based on load or other changes to the tubing in light of the effects that a jet pump can have on a well system, or one or more casing modules 512 for performing stress or other mechanical analyses based on load or other changes to the casing in light of the effects that a jet pump can have on a well system. System 500 can include one or more additional calculation engines 506 for performing one or more operations based on one or more output modules including information relating to or based on jet pumps or jet pump operations. For example, a calculation engine can calculate one or more conditions in light of a casing or tubing module as described above, including information such as initial or other casing and/or tubing landing, loading or other mechanical conditions. Such conditions can likewise be expressed by or otherwise included in one or more output modules 508, including being communicated to a system analysis module 514 for analyzing one or more system characteristics based on the other modules of system 500. System analysis module 514 can include, for example, a module for modeling or otherwise analyzing one or more characteristics of a single or multiple string well system, such as, for example, annular fluid expansion, wellhead movement, or other production operation conditions. Still further, system 500 can include one or more other calculation engines 506, such as for performing one or more calculations or operations based on the information in a system analysis module 514. In at least one embodiment, which is but one of many, such a calculation engine 506 can communicate one or more results to yet another output module 508, such as an output module for displaying or otherwise analyzing annular pressure buildup (APB). In this manner, and as will be understood by a person of ordinary skill having the benefits of Applicants' disclosure, system 500 can take into consideration the characteristics of one or more jet pumps operating within a well system and use those characteristics to model, approximate, simulate or otherwise determine the effects a jet pump can have on a well system, such as in a workflow process. These effects can include, but are not limited to, effects on production temperatures, production pressures, tubing stress, casing stress, fluid expansion, wellhead movement, loading and/or other aspects of a well system, such as single and multiple trap annular pressure buildup.

As mentioned above, each component of system 500 can be included in an interface, such as an expanded user interface. As such, each module of system 500, which can be any module, can include one or more graphical interfaces for allowing a user to input one or more factors of a well into the system. By way of an example, which is but one of many, FIG. 6 shows an illustrative graphical user interface ("GUI") 600 according to an embodiment of the present invention. In such an embodiment, GUI 600 can be a dialog interface for allowing an engineer or other user to enter various information relating to one or more events or components, such as regarding the definition of a drilling, production or other operation event, alone or in combination with one another or other events. GUI 600 can display and/or provide for the entry of one or more variables or other information (whether manually or preexisting, separately or in combination), such as in one or more graphics, blanks or spaces (hereinafter referred to as "boxes" for purposes of convenience and explanation). For example, in box 602, identifying information can be provided for one or more available or other jet pumps, such as a jet pump that can be used for one or more wells, or models or other analyses of any of them. In box 604, the model can be given information regarding a configuration relating to a jet pump, such a production tubing, annulus, or other configuration. In box 606, information regarding one or more operations can be entered into the model and/or displayed. For example, with respect to operations according to a particular embodiment, information can be provided regarding one or more flow paths, such as the size or type of a flow path or the type of fluid(s) or other materials flowing along a flow path. For instance, as shown in the exemplary embodiment of GUI 600, which is but one of many, a production flow path can include production fluid(s) (e.g., oil, gas, water, mixtures, etc.) flowing through production tubing, and an injection flow path can include injection fluid(s) (e.g., water, mixtures, etc.) flowing through an annulus, such as in a space surrounding the production tubing (e.g., between the tubing and casing) or another conduit disposed down hole. This need not be the case, however, and other configurations are possible and can be included in or otherwise taken into consideration by GUI 600. For example, the production flow can be through the annulus and the injection flow can be through the tubing. The model, such as through GUI 600, can also take into consideration the size of one or more components of a system, such as the size 608 of the production tubing and/or one or more other flow components. For illustrative purposes, size 608 of the exemplary production tubing is shown to be 3½", but this need not be the case and size 608 can of course be any size required by a particular application for a corresponding tubing or other component. One or more other items of information can also (or alternatively) be provided via GUI 600. For example, in box 610, information can be provided regarding how a model can be carried out, such as the conditions under which a model can be run. Such conditions can include, but are not limited to, transient conditions, steady state conditions, or other conditions, and can include one or more categories of other conditions or operational information, such as the treatment of a prior operation (e.g., undisturbed or otherwise treated), as shown for exemplary purposes in box 612. GUI 600 (and/or other GUI's according to the disclosure) can, but need not, also include one or more other functions or options, such as for accepting, cancelling, copying, resetting, displaying in further detail, or otherwise manipulating the information displayed in a GUI, separately or in combination with one another or other functionality, such as a help button for providing access to instructional or other materials or information.

At least one embodiment of the present inventions can include other interfaces for defining, modeling, estimating or otherwise analyzing a well system having a jet pump, alone or in combination with one or more of the interfaces described elsewhere herein. For instance, as shown in FIG. 7 for exemplary purposes, system 500 can include a GUI 700 for entering, accepting, applying, displaying or otherwise addressing or manipulating one or more details or variables (e.g., operating conditions or parameters) relating to a jet pump (which can be or include any jet pump). For example, in box 702, information can be provided regarding one or more pressures, such as for an operating pressure of a jet pump. In box 704, information can be entered regarding a depth at which a jet pump can be installed or disposed in a well. In boxes 706-712, information can be provided regarding other aspects of a jet pump system, such as, for example, in relation to (including values for) inlet temperature, injection rate of a power fluid, jet pump nozzle diameter, and the nozzle-to-throat area ratio, or other data, separately or in combination with one another. Other information, if applicable, can also be provided by way of GUI 700, such as one or more durations in box 714 and/or, in box 716, a location at which one or more of the above-mentioned parameters can exist, such as at the wellhead or another location in or relative to a wellbore. Any or all of such information regarding the performance of a jet pump can be calculated by or otherwise incorporated into system 500, which can include being incorporated into a computer model. Similar or other dialog boxes can be included to allow entry of additional information pertinent to one or more embodiments of a model, such as, for example, descriptions of well mechanical configuration, surface measure depth reference(s) (e.g., measured depth), Rotary Kelly Bushings ("RKB"), mean sea level, water depth, well total depth, well casing and/or tubing string configuration, drilling fluid, packer/completion fluid, cemented intervals, ocean current, and temperature profile (e.g., undisturbed), separately or in combination with one another or with one or more other parameters, in whole or in part. Further, it will be understood that each "box" described or otherwise referred to herein can include any number of boxes required by a particular application, such as 2, 3, 4, 5, 6 . . . n boxes, which can include one or more sub-boxes, if required or otherwise desired. Similarly, it will be understood that each box can, but need not, appear on a single GUI, and alternatively (or collectively) one or more combinations of boxes (which can be any boxes) can be shown on a single GUI. It will also be understood that not every box may be required for a particular application, and that if one or more boxes are not required, such boxes can, but need not, be shown, deleted, hidden, or otherwise disposed.

As other examples, dialog boxes can be included to allow entry of additional information pertinent to one or more embodiments of a model in view of one or more phases of operations. For example, during a drilling phase, one or more GUIs can provide for descriptions of drilling operation details, such as from undisturbed well conditions, sequence of drilling operation events (e.g., drilling, logging, circulating, tripping, running casing in hole, cementing operations), operations elapsed times, drilling fluid(s) and/or flow rate(s), among other things. As another example, during a production phase, one or more GUIs can provide for descriptions of production operation details from undisturbed well conditions, sequence of production events (e.g., circulation, shut-in, production, injection, gas lift), details of produced fluid type(s) (e.g., single, multi-phase, black oil, condensates), reservoir perforation depth, produced fluid temperature at perforation, production rates (oil, gas, water, and/or equivalent GOR), among other things.

Providing or sharing historical or other data and information among the modules and other components of system 500 can be performed in any manner that allows the components to access it during operation. In one embodiment, the historical data can be entered manually, for example, through a suitable graphical user interface implemented on a computer containing or accessing system 500 embodied as a computational model. In another embodiment, the data can be stored on a suitable storage medium, such as a hard disk, CD ROM, flash drive or other media that can be accessed or read by a processor executing the computational model. For example, data can be stored in the form of an Excel spreadsheet which can be accessed by the model. In still another embodiment, the data can be stored on a computer system having a computer processor separate from the computer processor executing the computational model. For example, the data can be provided through a system configured in a client-server architecture, where the data can be stored on a server computer which can be accessed over a network by the computational model that is running on a client computer processor. In still another embodiment, the computational model can access the data on a remote computer through the Internet or through distributed computing or cloud computing architectures. As an example, for a project in a given geographic area, a web service, in which the data is stored on a computer server, can be accessed by a client computer over the Internet. The client computer can also be the modeling computer, or it can simply retrieve the data for later access by the modeling computer. Accessing the data can include filtering inputs to narrow the scope of sources to obtain the needed jet pump or jet pump operation data. Filtering options can include jet pump ID or other characteristics, such as size, power, limitations, flow rates, etc. The computational model can consume and/or analyze the data as required by a particular application, in whole or in part.

A method for simulating, modeling or otherwise analyzing a well system, such as a computer-implemented method, can include providing a well system model adapted to define a mechanical or other configuration of the well system, such as based on one or more input parameters. A method can include providing a jet pump module including one or more jet pump models defining one or more jet pumps, and providing at least one calculation engine. A method can include inputting one or more input parameters, defining a mechanical configuration of the well system, selecting one or more jet pump models, integrating one or more jet pump models into a well system model, and computing one or more solutions to a model. A method can include determining at least one or more production conditions of a well system, such as a production condition or change to a production condition based on one or more effects of a jet pump. A method can include determining a plurality of production conditions, or changes in production conditions, such as one or more temperatures, pressures, or combinations of temperatures and pressures. A jet pump module can include a plurality of jet pump models, which can each define a different jet pump, and a method can include selecting at least one jet pump model from a jet pump module, such as by selecting one or more of a plurality of jet pump models, which can include selecting a model from a list displayed in or as a graphical user interface. A method can include creating a jet pump model, which can include defining one or more jet pump input parameters, such as pressure, depth, inlet temperature, injection rate, nozzle diameter, throat diameter, nozzle-to-throat area ratio, or a combination of any two or more of them. A well model can include one or more other models or modules, such as a casing model, casing module, tubing model or tubing module, separately or in combination, and a method can include performing one or more analyses on or using a model or module, such as a stress analysis, strain analysis, loading analysis, thermal flow analysis, pressure analysis, movement analysis, or other analysis. A method can include determining a state of a well system component, or model thereof, under one or more production conditions, such as a stress, temperature, pressure, mechanical, loading, or other state, and can include calculating a loading condition of at least one component of a well system or a model of any portion of a well system. A method can include incorporating at least one production condition into a calculation of one or more other conditions, variables or sets of variables, such as annular fluid expansion, wellhead movement, annular pressure buildup, a combination thereof, a state or condition of any of them, or one or more values relating to any of the foregoing. A system for simulating, modeling or otherwise analyzing a well system can include a computer system adapted to perform one or more of the method steps disclosed herein. A system can include any components required by a particular application, such as, for example, memories, processors, displays, or other components, such as power and cooling components, separately or in combination. A computer readable medium can have instructions stored thereon that, when executed by a processor, can cause the processor to perform a method including accessing a well system model, which can define a mechanical configuration of a well system, accessing a jet pump model, which can define a configuration of a jet pump, integrating the jet pump model and the well system model, such as to create a combined model or combined well system model, computing one or more solutions to a model, such as a combined model, and determining one or more production conditions of a well system. One or more models can be based on one or more input parameters, such as one or more defined inputs. On a computer readable medium, at least one production condition can be one or more of a production temperature, a production pressure and a combination thereof, and a jet pump model can be one of a plurality of jet pump models within a jet pump module, such as wherein each of the plurality of jet pump models can define a different jet pump. A computer readable medium can include instructions stored thereon that, when executed by a processor, can cause the processor to prompt or allow a user to define one or more jet pump input parameters, such as by way of one or more GUIs or other interfaces. The jet pump input parameters can include one or more of pressure, depth, inlet temperature, injection rate, nozzle diameter, throat diameter, nozzle-to-throat area ratio, and a combination thereof. A computer readable medium can include instructions stored thereon that, when executed by a processor, can cause the processor to perform a stress analysis on at least one of a casing model and a tubing model under at least one production condition, perform one or more of a wellbore thermal flow, stress and well loading analysis on one or more components of a well under at least one production condition affected by a jet pump, or calculate a loading condition of at least one component of a well system under one or more production conditions.

Other and further embodiments utilizing one or more aspects of the inventions described above can be devised without departing from the spirit of Applicants' inventions. For example, the systems and methods disclosed herein can be used alone or to form one or more parts of another modeling, simulation or other analysis system. Further, the various methods and embodiments of the workflow system can be included in combination with each other to produce variations of the disclosed methods and embodiments. Discussion of singular elements can include plural elements and vice-versa. References to at least one item followed by a reference to the item may include one or more items. Also, various aspects of the embodiments could be used in conjunction with each other to accomplish the understood goals of the disclosure. Unless the context requires otherwise, the word "comprise" or variations such as "comprises" or "comprising," should be understood to imply the inclusion of at least the stated element or step or group of elements or steps or equivalents thereof, and not the exclusion of a greater numerical quantity or any other element or step or group of elements or steps or equivalents thereof. The device or system may be used in a number of directions and orientations. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by Applicants, but rather, in conformity with the patent laws, Applicants intend to fully protect all such modifications and improvements that come within the scope or range of equivalents of the following claims.

What is claimed is:

1. A computer-implemented method for simulating a well system having one or more jet pumps using a Graphical User Interface (GUI) that streamlines performance analysis of the well, the method comprising:
    providing a well system model configured to define a mechanical configuration of the well system based on at least a first input parameter;
    providing a jet pump module including at least one jet pump model that defines at least one jet pump, wherein the at least one jet pump model includes an injection rate of a power fluid parameter, a jet pump nozzle diameter parameter, and a nozzle-throat area ratio parameter, using at least one jet pump definition in which the jet pump employs a power fluid including water that is injected down a wellbore of the well system through a first flow stream that is then mixed with hydrocarbon production and pumped back to the surface through a second flow stream;
    providing at least one calculation engine;
    providing the GUI configured to selectively present a plurality of interactive dialog boxes that enable a user to enter one or more input parameters pertinent to the at least one jet pump model; inputting, using the GUI, at least the first input parameter into the well system model;
    defining the mechanical configuration of the well system;
    selecting the at least one jet pump model from a list displayed by the GUI;
    integrating the at least one jet pump model into the well system model to create a combined model; computing a solution to the combined model; and
    determining at least one production condition of the well system based on the solution to the combined model, wherein the at least one production condition is selected from a group consisting of production temperature, production pressure and a combination thereof.

2. The method of claim 1, further comprising determining a plurality of production conditions.

3. The method of claim 1, further comprising:
    wherein the jet pump module includes a plurality of jet pump models each defining a different jet pump; and
    wherein selecting the at least one jet pump model from the list displayed by the GUI comprises selecting at least one of the plurality of jet pump models from the list displayed by the GUI.

4. The method of claim 1, further comprising creating a jet pump model.

5. The method of claim 4, further comprising defining one or more jet pump input parameters presented by the GUI.

6. The method of claim 5, wherein the one or more jet pump input parameters presented by the GUI are selected from the group consisting of pressure, depth, inlet temperature, injection rate, nozzle diameter, throat diameter, nozzle-to-throat area ratio, and a combination thereof.

7. The method of claim 1, wherein the well system model includes a casing model and further comprising:
    performing a stress analysis of the casing model; and
    determining a stress state of the casing model under the at least one production condition.

8. The method of claim 1, wherein the well system model includes a tubing model and further comprising:
    performing a stress analysis of the tubing model; and
    determining a stress state of the tubing model under the at least one production condition.

9. The method of claim 1, further comprising calculating a loading condition of at least one component of the well system under the at least one production condition.

10. The method of claim 1, further comprising incorporating the at least one production condition into a calculation of at least one variable.

11. The method of claim 10, wherein the at least one variable is selected from the group consisting of annular fluid expansion, wellhead movement, annular pressure buildup and a combination thereof.

12. A non-transitory computer readable medium having instructions stored thereon that, when executed by a processor, cause the processor to perform a method for simulating a well system having one or more jet pumps using a Graphical User Interface (GUI) that streamlines performance analysis of the well, the method comprising:
    accessing the GUI configured to selectively present a plurality of interactive dialog boxes that enable a user to enter one or more input parameters pertinent to at least one jet pump model;
    accessing, using the GUI, a well system model that defines a mechanical configuration of a well system based on at least a first well input parameter presented by the GUI;
    accessing, using the GUI, a jet pump model that defines at least one jet pump, wherein the at least one jet pump model includes an injection rate of a power fluid parameter, a jet pump nozzle diameter parameter, and a nozzle-throat area ratio parameter using at least one jet pump definition based on at least a first jet pump input parameter presented by the GUI;
    selecting the jet pump model from a list displayed by the GUI, in which the selected jet pump model employs a power fluid including water that is injected down a wellbore of the well system through a first flow stream that is then mixed with hydrocarbon production and pumped back to the surface through a second flow stream;

integrating the jet pump model into the well system model to create a combined model; computing a solution to the combined model;

and determining at least one production condition of the well system based on the solution to the combined model, wherein the at least one production condition is selected from a group consisting of production temperature, production pressure and a combination thereof.

13. The non-transitory computer readable medium of claim 12, wherein the jet pump model is one of a plurality of jet pump models within a jet pump module, each of the plurality of jet pump models defining a different jet pump.

14. The non-transitory computer readable medium of claim 12, further comprising instructions stored thereon that, when executed by a processor, cause the processor to perform a method comprising the GUI prompting a user to define one or more jet pump input parameters.

15. The non-transitory computer readable medium of claim 14, wherein the one or more jet pump input parameters presented by the GUI are selected from the group consisting of pressure, depth, inlet temperature, injection rate, nozzle diameter, throat diameter, nozzle-to-throat area ratio, and a combination thereof.

16. The non-transitory computer readable medium of claim 12, further comprising instructions stored thereon that, when executed by a processor, cause the processor to perform a method comprising performing a stress analysis on at least one of a casing model and a tubing model under the at least one production condition.

17. The non-transitory computer readable medium of claim 12, further comprising instructions stored thereon that, when executed by a processor, cause the processor to perform a method comprising calculating a loading condition of at least one component of the well system under the at least one production condition.

* * * * *